United States Patent [19]
Allen et al.

[11] Patent Number: 5,984,619
[45] Date of Patent: Nov. 16, 1999

[54] END EFFECTOR FOR UNLOADING DISKS AT A GRINDING STATION

[75] Inventors: Ronald Allen, San Jose; Peter S. Bae, Sunnyvale; Kenneth D. Fukui, San Jose; Gen E. Oshiro, Fremont, all of Calif.

[73] Assignee: Komag Incorporated, San Jose, Calif.

[21] Appl. No.: 09/187,624

[22] Filed: Nov. 6, 1998

Related U.S. Application Data

[63] Continuation-in-part of application No. 08/612,052, Mar. 7, 1996.

[51] Int. Cl.⁶ .................................................. B25J 15/06
[52] U.S. Cl. ........................... 414/752; 901/40; 294/64.1
[58] Field of Search .................... 414/752, 744.1; 294/64.1; 901/40

[56] References Cited

U.S. PATENT DOCUMENTS

| | | |
|---|---|---|
| 4,786,564 | 11/1988 | Chen et al. . |
| 4,909,376 | 3/1990 | Herndon et al. . |
| 4,988,578 | 1/1991 | Yamashita et al. . |
| 5,000,651 | 3/1991 | Akagawa et al. . |
| 5,067,762 | 11/1991 | Akashi . |
| 5,180,640 | 1/1993 | Yamashita et al. . |
| 5,201,913 | 4/1993 | Vliet ........................................ 294/64.1 |
| 5,216,843 | 6/1993 | Breivogel et al. . |
| 5,245,796 | 9/1993 | Miller et al. . |
| 5,284,416 | 2/1994 | Schmidt et al. . |
| 5,456,627 | 10/1995 | Jackson et al. . |
| 5,541,130 | 7/1996 | Kempf . |
| 5,549,340 | 8/1996 | Nagai et al. . |
| 5,718,559 | 2/1998 | Freund ..................................... 294/64.1 |

FOREIGN PATENT DOCUMENTS

| | | |
|---|---|---|
| 0 222 459 | 5/1987 | European Pat. Off. . |
| 0 269 097 | 6/1988 | European Pat. Off. . |
| 0 545 610 | 6/1993 | European Pat. Off. . |

*Primary Examiner*—Christopher P. Ellis
*Assistant Examiner*—Gregory A. Morse
*Attorney, Agent, or Firm*—Skjerven, Morrill, MacPherson, Franklin & Friel LLP; David E. Steuber

[57] ABSTRACT

An end effector for loading and unloading a magnetic information storage circular disk on a grinder carrier surface includes an effector block, an annular vacuum cup, including vacuum apertures, attached to and extending from the block and a vacuum source for attaching the cup to the disk. The annular cup surrounds and abuts against a periphery of a central aperture of the disk. A disk-carrying effector further includes a series, preferably three, of spaced vacuum cups extending radially outwardly of the annular vacuum cup. The overall effector is placed into abutment with radially outward portions of the disk surface and used to reliably unload a ground disk from a grinding surface. The spaced vacuum cups compensate for any non-planarity of the disk to be picked up caused by uneven wear of the grinder surface upon which the disk rests.

8 Claims, 9 Drawing Sheets

END EFFECTOR FOR UNLOADING DISKS AT A GRINDING STATION

This is a continuation-in-part application of U.S. Ser. No. 08/612,052 filed Mar. 7, 1996.

FIELD OF THE INVENTION

The present invention relates to an apparatus for loading and unloading of magnetic information storage disks into and from a disk-processing station. More particularly, the invention is directed to an effector which loads and unloads a circular storage disk into and from a disk surface grinder.

BACKGROUND OF THE INVENTION

Information storage disks, sometimes known as hard disks are typically made of aluminum and are typically subjected to a nickel-phosphorous plating step and a subsequent coating step using various thin film magnetic alloys, such as sputtered or vapor deposited alloys of cobalt, chromium, nickel and platinum or other cobalt alloys deposited on the disk, as seen in U.S. Pat. Nos. 5,180,640, 4,786,564 and 4,988,578 and in the prior art referenced in these patents. In normal practice the original disk blank surface is ground and following the NiP plating step, the blank is polished and cleaned to insure a smooth surface for reception of the magnetic alloy.

Most operations and processing steps in the production of storage disks have been automated including the use of robotic mechanisms for loading and unloading disks into and from a cassette and into a disc carrier for plasma or sputter magnetic particle coating of the disks. Prior to the coating step, it is necessary to grind the disk blank surface to arrive at an acceptable surface finish. Following grinding and a typical plating of NiP a subsequent polishing step is performed to arrive at a final surface finish suitable for a subsequent magnetic particle coating step. A typical apparatus for grinding and then polishing the disk has been an apparatus Model 9B14P available from SPEEDFAM Inc. of Chicago, Ill. This apparatus comprises a top platen for mounting various grinding or polishing equipment and a bottom platen onto which disks are manually placed and manually removed from a rotating carrier at the grinding or polishing station. In another system, known as the Seiko-Systems grinder/polisher automated system, disks are loaded in a carrier, the carrier is moved to a grinder or polisher station, and after grinding or polishing the carrier is moved to an unload station.

FIG. 1 schematically illustrates the prior art SPEEDFAM-type apparatus where cassettes are filled with disk blanks, typically aluminum disks of 130 mm, 95 mm or 65 mm in diameter with a beveled central aperture of 25 mm diameter (for a 95 mm disk) and a thickness of 31.5 mil (for a 95 mm disk), in cassette slots. The cassettes (not shown) are moved into the vicinity of the apparatus including a grinder or polisher 10 and removed by a worker from the cassette into a circular three-disk holder 12 positioned in depressions 14 on the holders 12 which holders are rotatively drivable by gear teeth 15 on the inner periphery of a ring gear 17 and gear teeth 19 (FIG. 2) on the periphery of the holders 12 and by gear teeth 13a on a sun gear 13. Only a few gear teeth are shown but it is to be understood that the gear teeth extend 360° around each gear and holder. A center support column 13b supports the SPEEDFAM mechanism. Each disk is manually placed in a circular disk-receiving depression or recess 16 in each disk holder and after all the disk positions, for example, three positions in each of fourteen holders, for a total of forty-two disks, have been manually loaded, the appropriate grinding or polishing cycle is commenced. A control box 8 is mounted on platen 45. Each disk is ground or polished as each set of three disks are rotatively moved under a grinder or polisher depending from the top platen. Grinding or polishing occurs in the presence of a pumped supply (not shown) of a water slurry in the grinder or polisher supplied through the top platen. Cleaning water exits from nozzles 18 for cleaning the ground or polished disks. Suitable standard abrasive materials for the water slurry are available from SPEEDFAM, Inc. The ground or polished disks are then manually removed from the disk holders and inserted into a cassette.

The above described manual handling of the disks causes production delays and attendant high labor costs and can and do cause scratches and other damage, such as deformation of the disk flatness, on the disk surface by lateral and bending movements of the disks against side edges of the disk holders and the platen surfaces. These problems and effects are particularly prevalent in the unloading operations since, due to the water slurry environment of the grinding or polishing steps, the disks can be firmly adhered by surface tension or stiction to the wet lower platen surface under the disk holders. The disks have to be laterally pried up off the surface with attendant risk of causing scratches and damage to the disk(s). The result of angular random or other scratches or bending of the disks can result in imperfect manufactured disks. In use the damaged surfaces will result in having missing bits of inputted magnetic information on the disk tracks.

SUMMARY OF THE INVENTION

The present invention eliminates surface scratches and other substrate damage due to manual disk handling by providing for robotic loading and unloading of disks into a grinding or polishing apparatus with little or no lateral movement of the disk. The invention particularly overcomes surface tension on the underside of disk which has been subjected to a water slurry environment and to provide fast, repetitive and precise loading and unloading of a disk regardless of the carrier ring stopping position. Further the invention includes a vision positioning apparatus which is not effected by external lighting and where the vision positioning apparatus is not adversely effected by the water slurry environment of the grinding and polishing operations. The above improvements and functions are provided without changing the spacing between the top and bottom platens of the prior art grinding or polishing apparatus.

A robotic effector is provided which is mounted on the end of a robot arm which is movable laterally into a position between the horizontal top platen and the horizontal bottom platen of the grinding or polishing apparatus. The effector includes an effector block, preferably a solid, black oxidized aluminum cylindrical block, having an annular rubber vacuum cup attached to the block bottom which cup, upon placement to surround the disk central aperture, holds the disk on the vacuum cup upon imposition of vacuum from a vacuum source. All pick-ups in unloading and loading are in a vertical orientation without damage-causing lateral movement. In a further improvement the effector block includes an axial through-bore and a pressurized air source is provided, such that imposition of air from that source through the bore and disk aperture and radially outward under an underside surface of the disks overcomes surface tension or stiction developed in the water slurry environment between the disk underside surface and the carrier surface onto which the disk was positioned.

In another embodiment of the invention a plurality of effectors mounted on an effector base simultaneously loads and unloads a matching plurality of disks on and from the carrier surface. The effector base may also contain depending hold-down fingers for holding the carrier surface down, thus preventing any interference between the carrier and the disks being removed. The effector base preferably includes a device or subsystem for aligning the effector base (and the effector and disk(s) vacuum-mounted thereon) with respect to the carrier surface.

This subsystem includes a first camera and a second camera for determining an x and y axis position of the effector and a means for determining a theta rotation position of the effector. Theta position is determined by sensing a mark or other indicia (not shown) on the disk holders. Each camera includes a lens surrounded by a circular series of light emitting diodes, such as red-spectrum emitting diodes, which provide a light source at a prescribed focal distance and a differential reflection from the carrier surface and from the bottom of a fiducial hole on the carrier surface. The fiducial holes, typically three, are offset from the disk mounting positions preferably on the holder surface and a maximum differential reflection is sensed. The exposed holder surface is one color and the bottom of the hole is another color. When the source is perfectly aligned with a fiducial hole at a maximum reflection differential, the robot arm, the effector base and the fixed effectors are then in a proper aligned position to vertically load or unload the three or more disks simultaneously into or out of the disk-receiving circular depressions in the holder surface.

In a further improvement the lens of each camera is protected from the water slurry environment of the grinding or polishing apparatus by having the ring light act as a lens extension including an apertured transparent or other cap spaced from the lens and within the annulus of the ring light. A pressurized air supply enters the ring light housing transversely to provide an air stream transverse of the lens outer surface which air stream then exits through the cap aperture to prevent water droplets and debris from the water slurry abrasive grinding and polishing mediums from impinging onto the camera lens.

In the overall disk loading and unloading system a disk transfer table is provided where disks from a holding cassette (not shown) are transferred to positions on the table. A loading robot with an attached effector base loads disks from the disk transfer table. Typically three disks which are aligned on the table are loaded by being picked up by three effectors on an effector base and then simultaneously moved by a robot arm into disk-receiving circular depressions in a disk holder as controlled by the cameras and fiducial holes. After the grinding or polishing operations has been completed the robot arm and effector base is again aligned with respect to the fiducial holes and the base and effectors moved downwardly to initially vacuum attach the effectors to the disks and to simultaneously actuate pressurizing air through through-bores in the effectors and under the undersides of the disks to overcome the stiction between the disks and the bottom of the disk-receiving depressions which is the top surface of the bottom platen. The completed ground or polished disks attached to the effectors are then moved by the robot arm and unloaded from the effectors at the disk transfer table for transfer to a receiving cassette (not shown).

The invention includes a method of loading and unloading a magnetic information storage disk having a central aperture to a carrier surface on which the disk is to be processed comprising: a) providing a robotic effector having a bottom annular vacuum cup; b) moving the effector toward a disk such that the effector vacuum cup is positioned to abut a peripheral top surface of the disk surrounding the disk aperture; c) applying a vacuum to the vacuum cup to effectively hold the disk; d) moving the effector and the held disk down vertically to position the disk in a disk holder; e) removing the effector from the disk by turning off the vacuum and injecting pressured air (normally about 5 psi) through the vacuum holes to drop the disks into holder depressions; f) subjecting the top surface of the disk surrounding the central aperture to a processing step; g) upon completion of the processing step, repeating steps b) and c); then passing pressurized air through the effector, past an interior of the annular vacuum cup and under the underside of the disk to overcome surface tension between the disk and the lower platen top surface; and (h) robotically raising the effector and the vacuum-attached disk from the disc holder.

A further embodiment of the apparatus and method includes providing an effector base and at least two cameras positioned on the base and spaced from the effector, each camera including a lens and a series of light emitting diodes in a ring light surrounding each lens; providing an apertured cap in the ring light and spaced from each lens; flowing pressurized air through a ring light cover and ring light into a space between the lens and the cap and outletting the pressurized air out of a central aperture in the cap to prevent water droplets and debris from the processing steps from impinging on the lens; and controlling the position of the base by sensing a differential reflection of light from the diodes and by moving the effector base with respect to at least one fiducial hole on the carrier surface offset from a desired position of the disk on the carrier surface.

In another improvement an added series of suction cups are associated with the end effector particularly for picking up disk from the grinder surface, sometimes called the "grinding stone." Such an addition improves the reliability of the robot end effector in picking up disks. This solves a problem arising from inconsistent planarity of the grinding stone due to inconsistent wear from use. This results in some disks which are loaded on the grinding stone not being in the same plane as other disks. The addition of a series of small vacuum cups, typically three in number for each annular effector, compensates for the non-planarity in the disk being unloaded from the grinding stone operation, thus increasing the unload reliability. The vacuum cups preferably are positioned on the effector base about three centimeters radially outwardly from each annular effector and are spaced at 120° positions from the central longitudinal axis of the effector. The cups have an active flexible lip portion in substantially the same plane as the distal end of each annular effector, which cups overlie portions of a disk outwardly from the central aperture of the disk and outwardly of the annular effector. The flexibility of the lip portions, when pressed on the disk and their wide-spacing, compensates for any inconsistent planarity of the grinding surface which would cant a disk.

DETAILED DESCRIPTION

Figure 1:
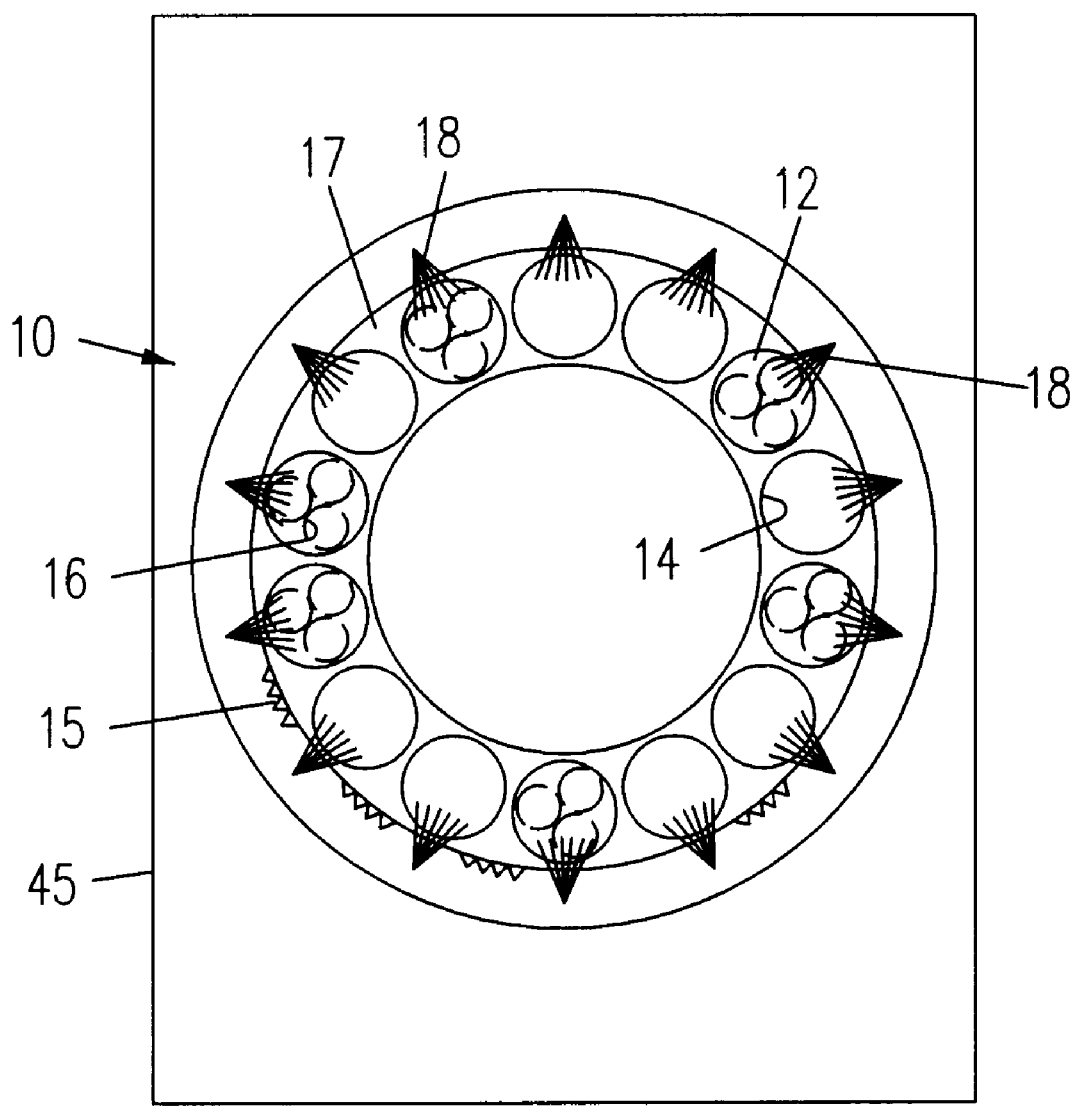
FIG. 1 is a schematic top view of a typical grinding or polishing station of the prior art.
Figure 2:
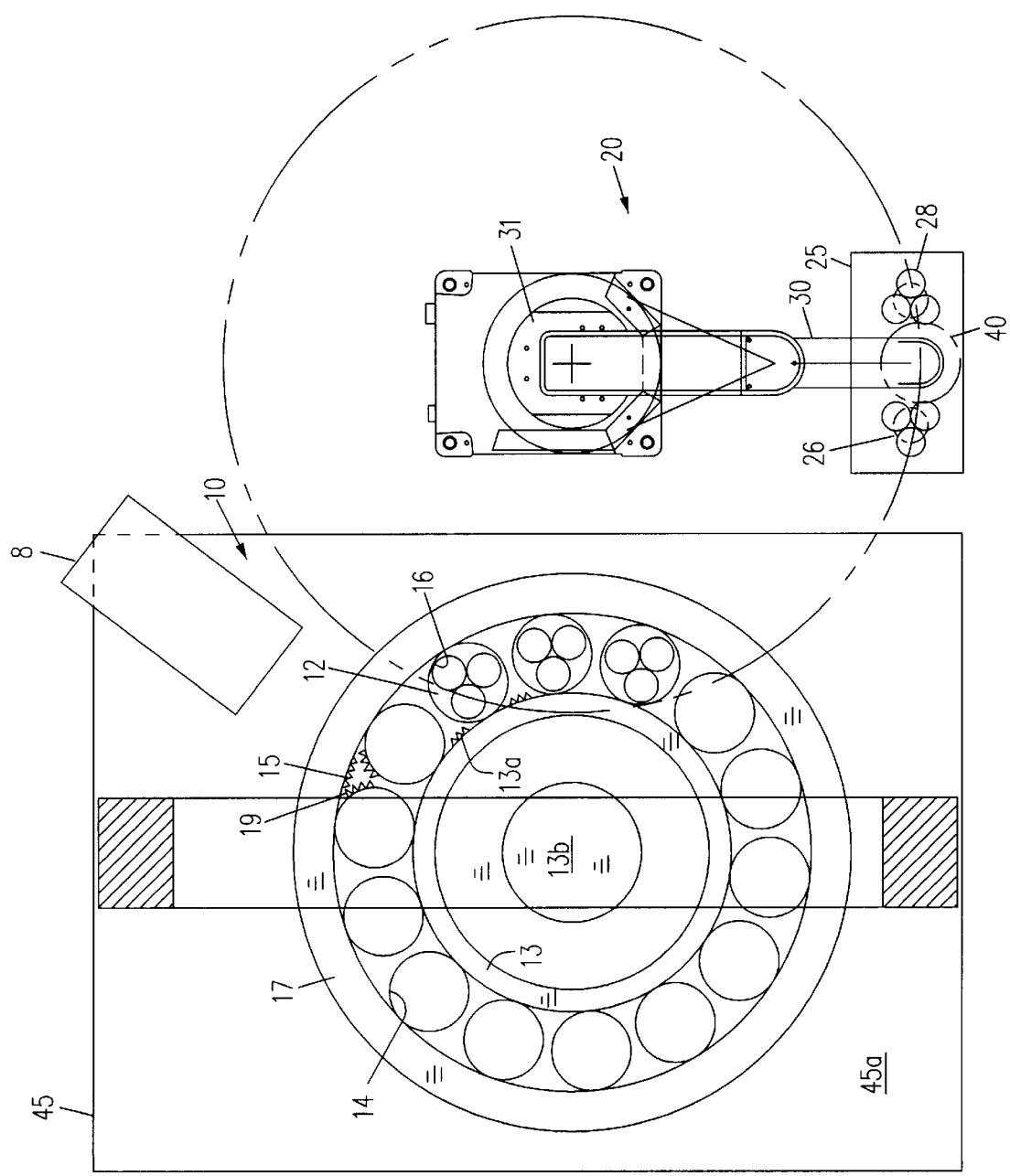
FIG. 2 is a schematic top view of the robotic system of the invention for loading and unloading a series of disks to a grinding station or a polishing station.

FIG. 2 illustrates the application of a robotic system 20 which is interposed between the platens (FIG. 3) of a grinder (or polisher) 10. A robot arm 30 moves to a disk transfer table 25 and picks up three "dry" blank disks 11 at a table "dry" position 26 by three effectors fixed on an effector base 40 which is fixed on the robot arm 30. The robot arm is then moved and positioned between the grinding or polishing apparatus platens (FIG. 3) for simultaneously loading the three disks 11 into respective depressions 16 in the three disk holders 12, or other carrier surface. After grinding or polishing at respective grinding or polishing stations (performed by separate grinding and polishing apparatus and a water spray cleaning, the ground or polished disks are unloaded from the holders or other carrier surface as hereafter described to the disk transfer table at a "wet" ground or polished disk position 28 on the disk transfer table 25. The polished disks are then normally put in cassettes for transport to other processing stations such as plasma coating with magnetic materials. The robot arm is movable circularly (as seen in dashed line circle) and radially so as to become aligned as hereafter described, with a set of three disks in the depressions—or aligned with the depression in a loading operation. Thus the transfer operation may be accomplished wherever the ring gear 17 is stopped, since the effector base can always be aligned with at least one set of three depressions in the disk holder. The robot arm is connected to a robot base 31. An overall robot such as a Model A-510 available from Fanuc, Inc., Detroit, Mich. may be utilized.

Figure 3:
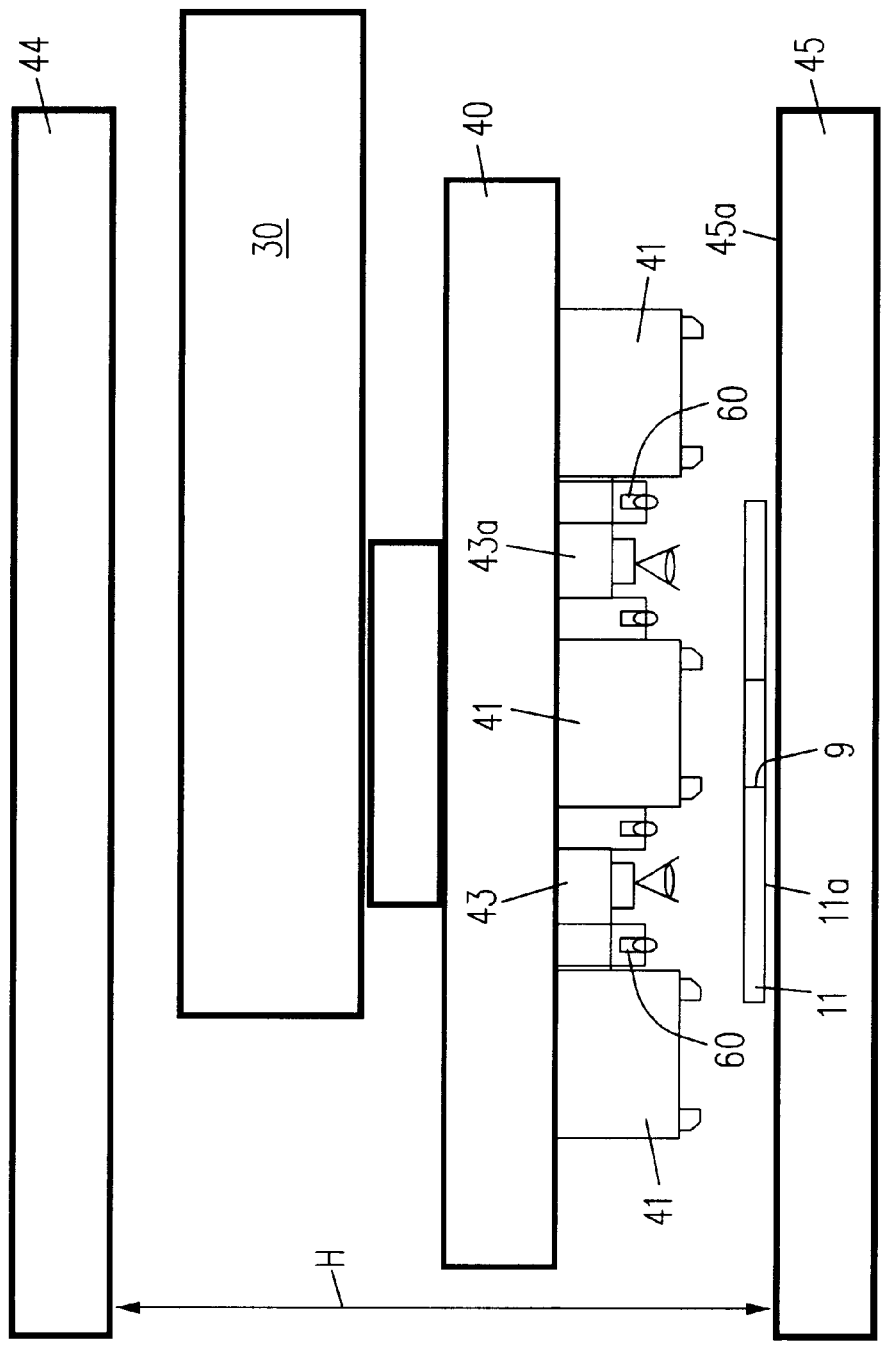
FIG. 3 is a schematic side view of a robot arm with attached effector base mounting three effectors and a two-camera alignment system.

FIG. 3 shows the robot arm 30 between the upper platen 44 and lower platen 45 in a fixed vertical space H. The upper platen mounts the grinder or polisher (not shown). The robot arm 30 mounts an effector base 40, on to which typically three effectors 41 are spacedly mounted with their central axes in a triangular orientation around the central axis of the effector base. A vision position system including alignment cameras 43 and 43a depend from the effector base or other robot arm structure. The robot arm, the attached effectors 41 and the cameras are moved laterally to a position between the platens looking down at the carrier surface and when the effectors are properly positioned by the vision alignment system with respect to the disks the effector base is moved vertically downward to place or pick up disks 11 and to properly load or unload the disks in or from the disk holder rotatively mounted on the bottom platen 45. The robot arm and effector base are moved downwardly so as to effect vacuum pick up of the disks by an annular vacuum cup 42 (FIG. 4).

Figure 10:
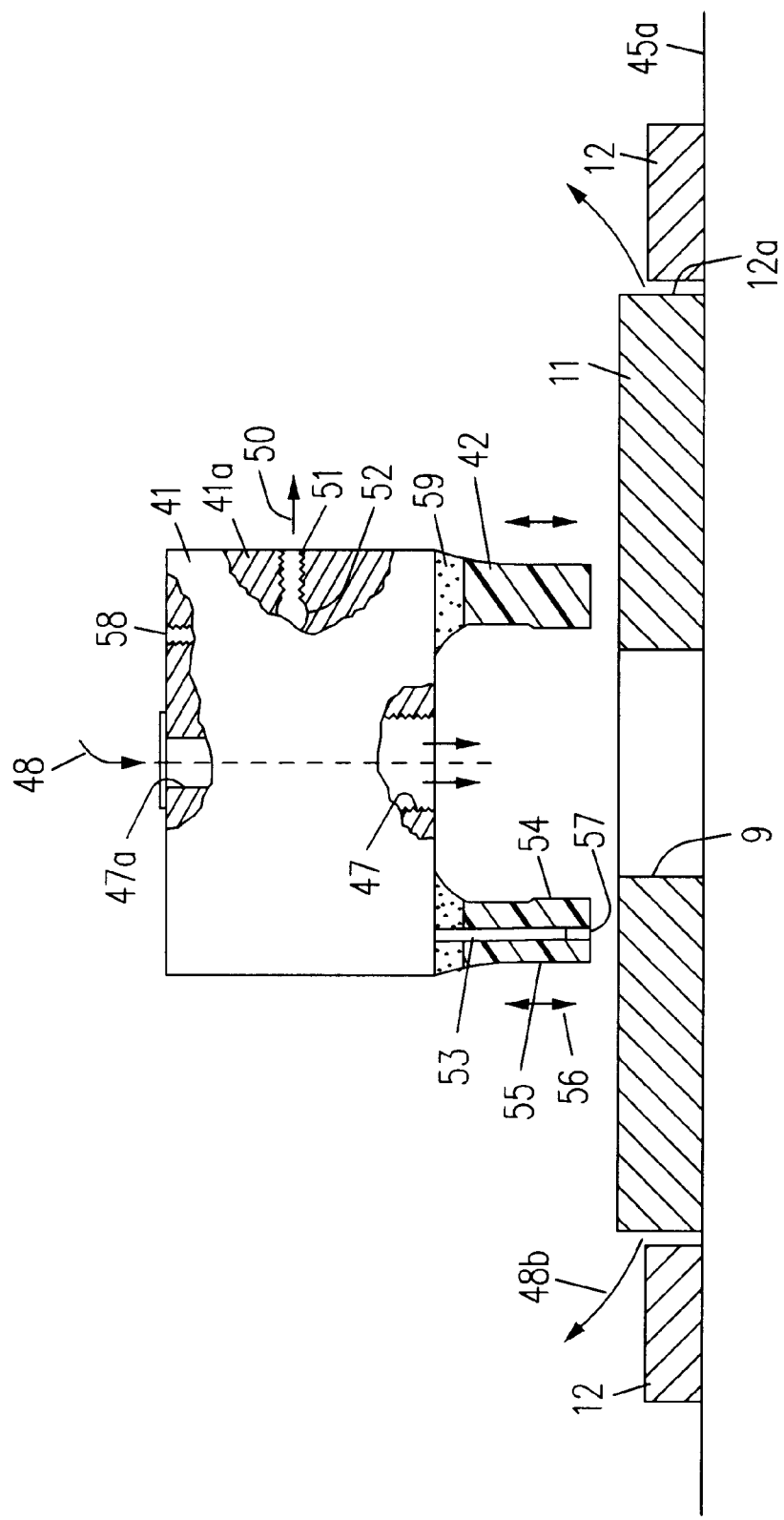
FIG. 10 is a schematic partially cut-away cross-sectional view of the effector and carrier in an about-to-unload disk position.

As seen most clearly in FIG. 10 each effector 41 includes an effector block 41a, preferably a solid, black oxidized aluminum cylindrical block, having a annular rubber vacuum cup 42 attached to the block bottom. The cup may be a natural rubber or a synthetic rubber or elastomer such as a silicone rubber of about 70 Durometer attached to and sealed on the block by an elastomeric sealant 59 such as silicone caulking. The annular vacuum cup 42 is sized to surround the disk central aperture 9 for holding the disk 11 on the cup upon imposition of vacuum (arrow 50) from a vacuum source (not shown). A suitable vacuum hose or tube (not shown) is threadedly connected to a threaded inlet 51 in the effector block which leads to a vacuum distribution passageway 52 in the block to distribute vacuum flow to spaced apertures 53 in the vacuum cup between outer and inner end walls 54 and 55. A vacuum chamber 57 is formed between the outer and inner walls into which a circular series of apertures 53 for example, twenty-four vertical apertures, in the cup annulus communicate. Thus an annular vacuum seal is formed on a disk approximately the width of annular vacuum chamber 57 between walls 54 and 55 around the outer periphery 9 of the disk central aperture upon downward movement of the cup (arrow 56). The inner diameter of wall 54 in one typical embodiment using a 95 mm disk is 27–28 mm. The width of walls 54 and 55 are about 1 mm. Apertures 53 have a diameter of about 1.5 mm. Threaded aperture 58 is provided on the block top to attach a pressurized air hose to provide pressurized air typically about 45 psi to a central bore 47a and a counterbore 47 which leads to the interior central aperture portion of the annular vacuum cup. A valve (not shown) outside the block allows pressurized air to enter and pass through the central through-bore 47, 47a of the block.

Figure 4:
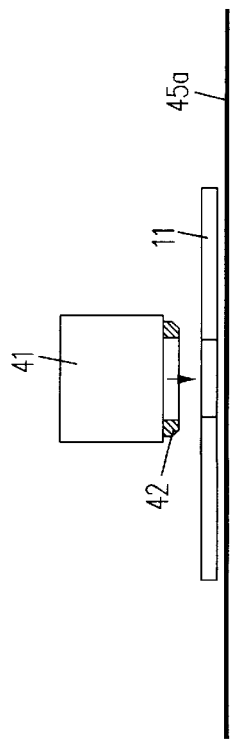
FIG. 4 is a schematic side view of an effector per se immediately prior to vacuum attachment to a disk.
Figure 5:
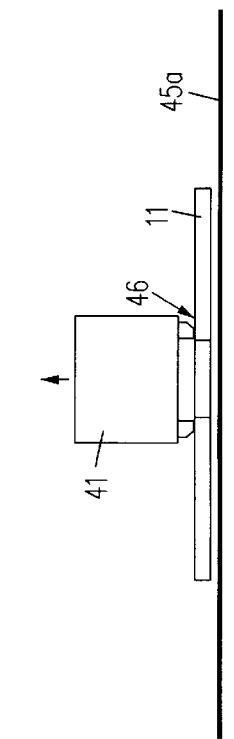
FIG. 5 is a schematic side view thereof with a disk being vacuum held by the effector.
Figure 6:
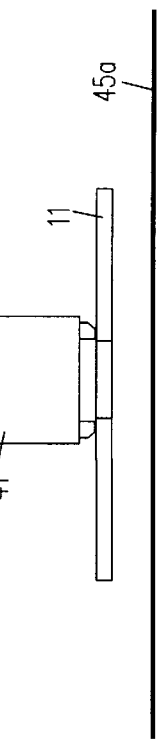
FIG. 6 illustrates the unloading of the disk from a carrier surface.

FIGS. 4, 5 and 6 illustrate the steps involved in the loading of a disk from a disk transfer table to the effector 41 mounted on a robot arm. In FIG. 4 the effector 41 is moved downwardly as shown by the arrow until the annular vacuum cup 42 abuts the disk 11. As shown in FIG. 5 a vacuum 46 is turned on and the disk is vacuum-held by the effector 41. The robot, more particularly the robot arm, then raises vertically (FIG. 6) to move the disk 11 from its supporting surface, be it the disk transfer table 25 (FIG. 2) or a platen surface 45a. For illustration purposes the up and down movement of the effector and its base is shown as moving relative to the top surface 45a of the lower platen 45. In FIGS. 4 and 5 the disk underside 11a and surface 45a are abutting, although a gap is shown for visual understanding.

Figure 7:
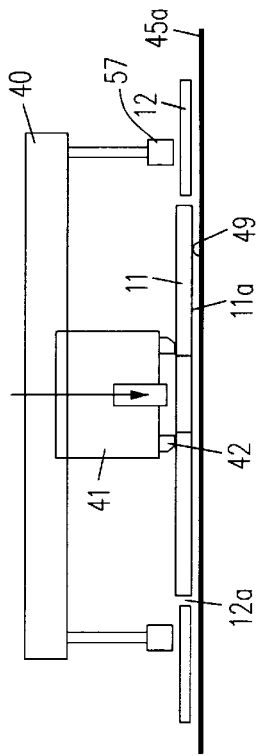
FIG. 7 is a schematic side view illustrating a first step of disk unloading.
Figure 8:
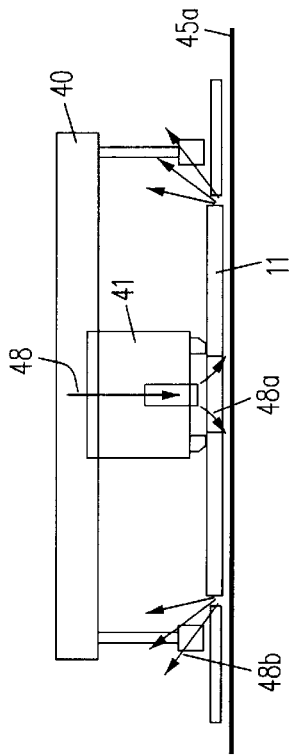
FIG. 8 is a schematic side view illustrating the overcoming of stiction between the desk and the carrier surface.
Figure 9:
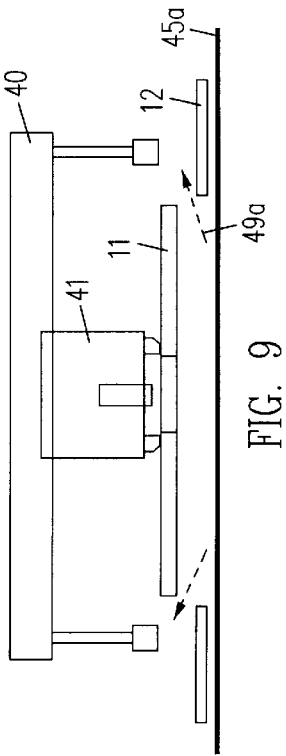
FIG. 9 is a schematic side view of a lifted effector with attached disk.

FIGS. 7–9 graphically illustrate a further improvement used when unloading a disk(s) from a recess or depression(s) 16 (FIG. 2) in the carrier disk holder. Due to the water slurry environment in the grinding station and the polishing station the disks 11, more particularly the undersides 11a, are held by surface tension or stiction firmly against the bottom platen top surface (FIG. 7). This stiction is shown at the gap 49 between disk under-surface 11a and the platen top surface 45a. Gap 49 is actually a face-to-face abutment of surfaces 11a and 45a but is shown as a gap for visual understanding.

To solve the stiction problem pressurized air 48 of about from 20 psi to about 40 psi is introduced through a through-bore in the effector block 41a (FIG. 10), passes through an entrance bore 47a and a larger counterbore 47, through the axial interior of the vacuum cup 42, through the disk central aperture 9 and under the underside 11a of the disk as best seen by arrows 48a and 48b in FIG. 8. It has been found that the vacuum and pressurized air can be turned on simultaneously and that one pressure pulse for about ½ second will dislodge the disk from the recess. This air flow overcomes the surface tension and as shown in FIG. 9 allows the effector base and effectors (one shown) to easily vertically raise without damaging the disk(s), while breaking the stiction 49 as shown by dotted arrows 49a.

Figure 11:
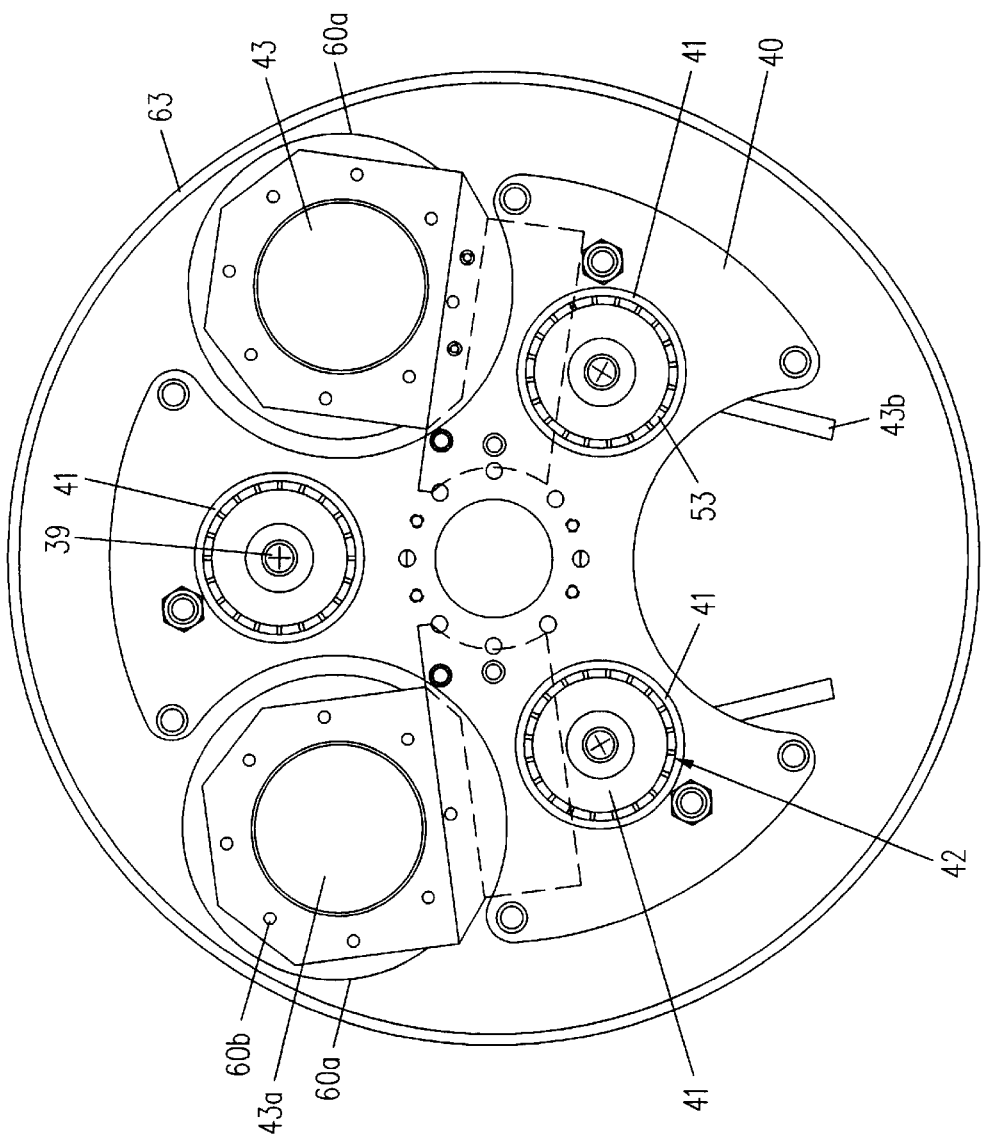
FIG. 11 is an underside view of the effector base showing the working ends of the effectors and cameras.
Figure 12:
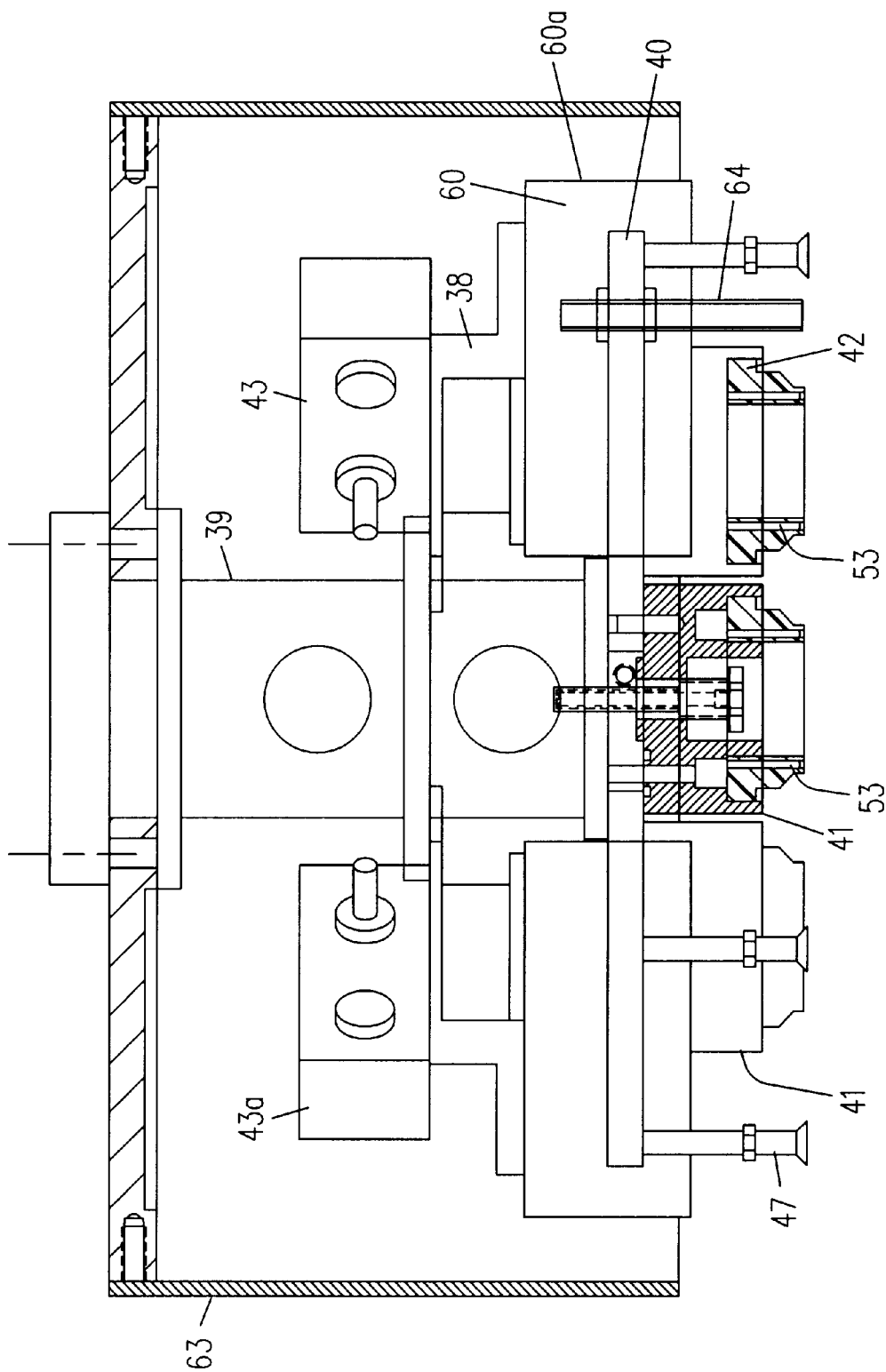
FIG. 12 is a side view of the effector base with the base cover and two of the effectors in cross-section and partially in cross-section.

FIG. 11 illustrates the underside of the effector base which is loading and unloading disks into and out of the grinding or polishing stations and which faces the lower platen of the apparatus. Effectors 41 have central axes 39 in a triangular orientation. While the invention has been described in terms of three effectors, six, eight, nine or more effectors may be ganged on the effector base. The multiple apertures 53 in the annular vacuum cup 42 are also clearly shown in each effector. Also shown are the cameras 43 and 43a, S each including a lens and a surrounding ring light 60 (FIG. 3) typically comprising eighteen light emitting diodes (LED's). The ring light is not shown in FIG. 11. It is mounted by extending fasteners into apertures 60b of a mounting plate. Cables 43b are shown extending to the cameras. A Z-shaped bracket 38 connected to center support column 39 supports the camera on a bracket top surface and supports the ring light 60 and the cover 60a on the bracket lower surface. The cameras may be a Model CCD with an 8 mm focal point and an F-stop of 1.3 available from Hitachi, Inc. The ring lights are available from Illumination Technology Inc., Syracuse, N.Y. As seen in FIG. 12 the ring lights of each camera are covered by a cover 60a and the overall cameras and effector base 40 is covered by cover 63. A sensor 64 such as an inductive probe or proximity sensor made by Baumer Electric of Fraunfeld, Germany, Model No. IF RM 08.P 1104/L depends from the base 40 to check by the inductive effect or by the Hall effect the presence of the disks in the disk holders 12.

The hold downs 47 hold the holders down against the bottom platen when the effector is unloading the disks from depressions 16 and while overcoming the stiction 49. This prevents any interference of the disks by the edges of the depressions 16. In FIG. 12 the effectors and annular vacuum cup are variously seen in side view (the left effector), in cross-sectional view of the FIG. 7–9 embodiment (the central effector) and in the cross-sectional view of the cup 42 of the FIG. 10 embodiment (the right effector).

Figure 13:
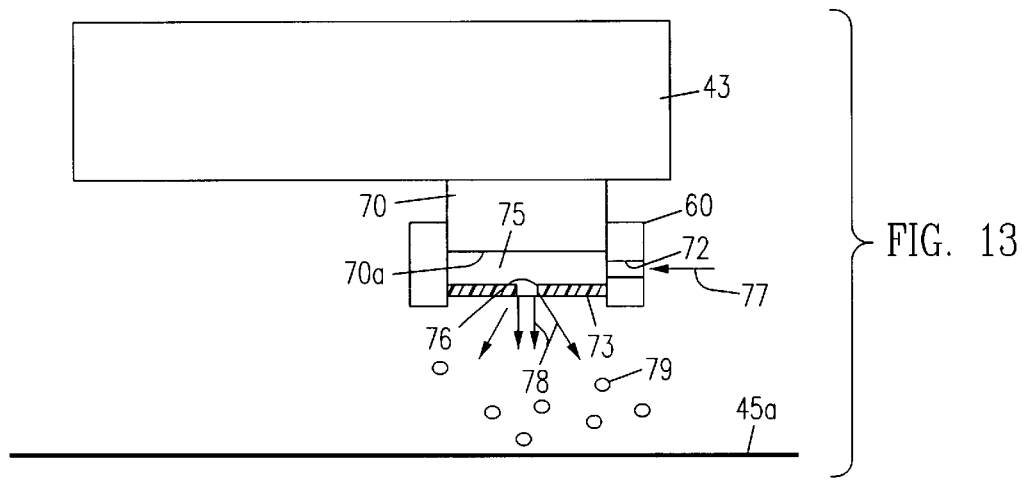
FIG. 13 is a schematic side view partially in section of the camera and lens extension of the invention.

FIG. 13 illustrates a further aspect of the invention where, due to the severe water slurry environment of the grinding or polishing apparatus, it is difficult to employ a vision positioning system for aligning the effector base to load and unload disks from the disk holder or carrier ring, particularly at any arbitrary rotative stopping position of the gear ring 17. The atmosphere surrounding the camera lens in the gap between the platens 44 and 45 and extending to surface 45a on the lower platen 45 is replete with water droplets and debris 79 (particularly abrasive particles and rough particles of aluminum ground off or polished off the unprocessed or plated disks). Ring light 60 and its cover 60a provides a cylindrical housing extension of the lens housing 70. The outer end of the ring light has a plastic cap 73 with a central aperture 76 sized, for example about 1.3 mm in diameter, to allow focusing of the digital image and to allow air to pass therethrough. The cover 61a and the ring light 60 includes a transverse passageway 72 which receives pressurized air (arrow 77), e.g. about 50–60 psi, which passes across the lens face 70a into chamber 75 between the lens face 70a and cap 73, and exits through aperture 76 with a fan-like air stream (arrows 78) which blows away the water droplets and debris away from the aperture 76 and prevents any unwanted impingement of the droplets and debris on the lens or interference with the vision alignment system. This air stream is "ON" when the effectors on the robot arm pass into the grinding or polishing zone between the platens.

Figure 14:
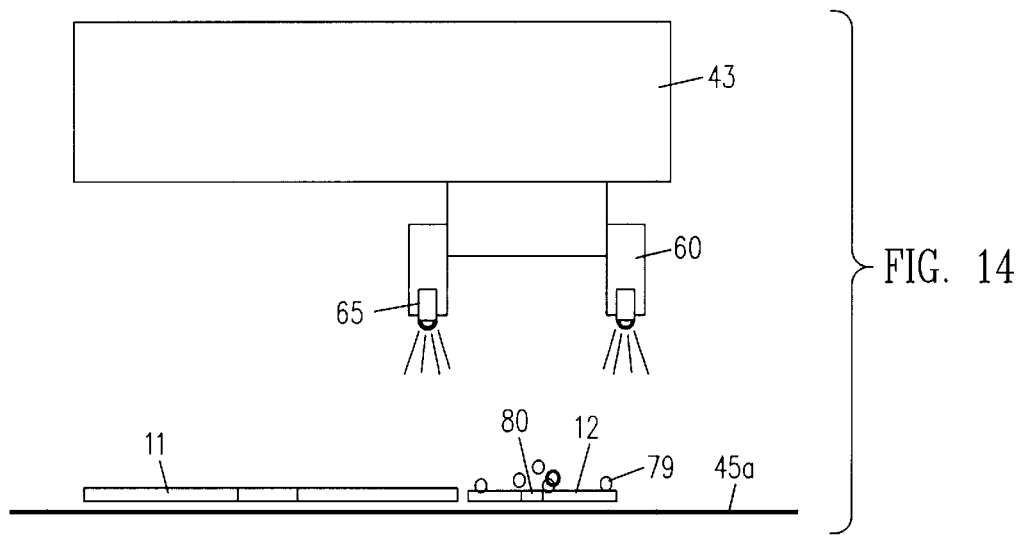
FIG. 14 is a schematic side view partially in section of the alignment system of the invention.
Figure 15:
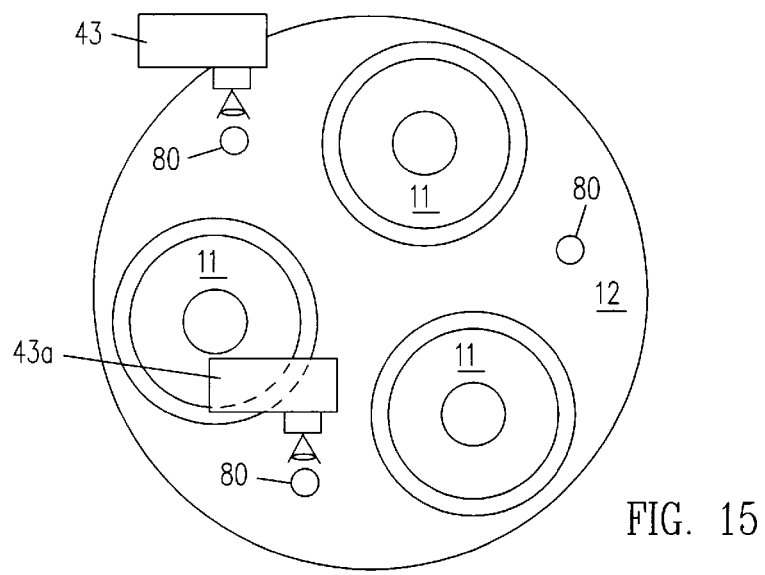
FIG. 15 is a schematic top view of the carrier surface and disk holders of the grinding station or polishing station.

The vision alignment system of the invention is seen in FIGS. 14 and 15 where the ring light 60 and a red LED light is directed to a series of fiducial holes 80 preferably on the holder 12. The focal length of the LEDs is about 3.8 cm and the reflectance of the light is sensed by the cameras (FIG. 12). When a maximum differential of reflected light is obtained by the focal point of the light being directed onto the bottom of the fiducial hole, a maximum differential reflectance is sensed. Since the bottom of the hole is actually part of a black or other contrasting color of platen surface 45a and the holder top surface is of aluminum or light color, the position of the robot arm and the attached effector base and effectors can be accurately ascertained. When so ascertained the robot arm is moved vertically to either load or unload the disks from the depressions in the holder 12. The gap between the disks 11 and the edges 12a of the depressions is exaggerated in FIGS. 7 and 8. A close fit, for example, a 0.2–0.3 mm gap is desired to prevent shifting of the disk in the depression or recess in holder 12. As the robot arm 30 is moved into the gap H and between the platens a fixed CCD camera (not shown) mounted in the top platen of the grinder or polisher senses the location of the disk holder 12 at a coarse position. The cameras 43 and 43a with the gap H are then operable looking down on the disk holder 12 to finely position the effector base on the robot arm by the relative reflectance of a fiducial hole surface and a holder surface, as described above.

Figure 16:
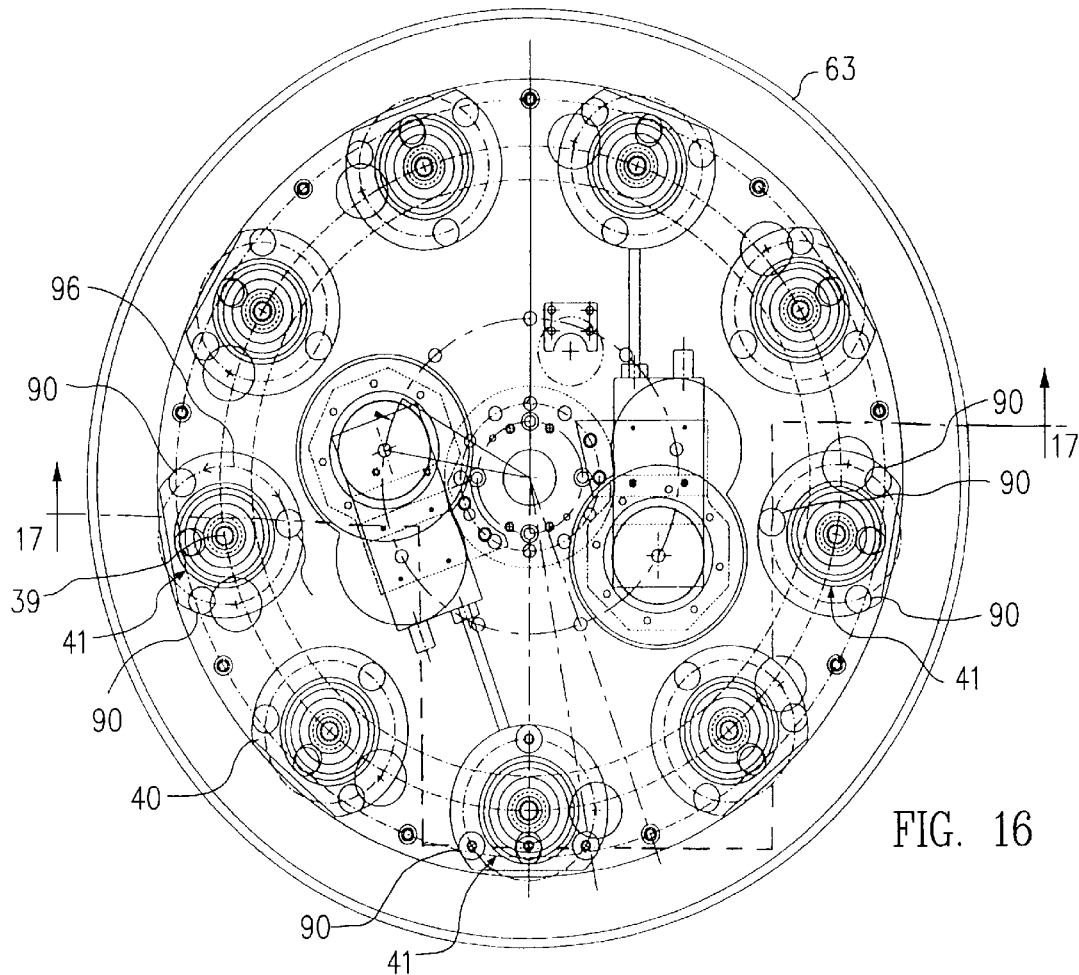
FIG. 16 is an underside of the effector base showing the effectors and surrounding vacuum cups.
Figure 17:
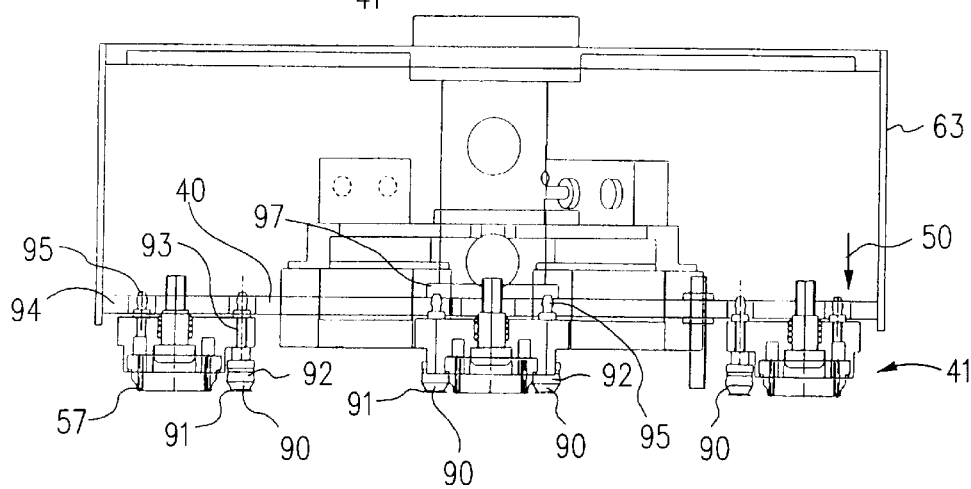
FIG. 17 is a cross-sectional view thereof taken on the line 17—17 of FIG. 16.

FIG. 16 and 17 show nine effectors 41 ganged on the effector base 40. The improvement used in unloading a disk includes spaced vacuum cups 90 radially and circumferentially surrounding each effector 41 and its central axis 39. Typically, three vacuum cups are utilized equally spaced 120° apart as shown by double-arrowed arc line 96. Cover 63 covers the periphery of the ganged effectors as also shown in FIGS. 11 and 12. As seen best in FIG. 17 the vacuum cups 90 include a circular distal lip portion 91 which is substantially in the plane of the bottom end of the vacuum chamber 57 between the outer and inner end walls 54 and 55 of the effector (FIG. 10). The spaced vacuum cups may be manufactured of polyurethane material having a durometer of about 20 and typically have a diameter of from about 8 mm to about 10 mm. A standard vacuum cup identified as Part No. GPT-8 from SMC Co. of Japan may be used. The vacuum cups 90 include a dependable flexible lip 91 extending from a cylindrical housing block 92. The interior of each vacuum cup 90 is in communication by a central axial vertical through-bore 93. The through-bore extends through the block 92 affixed to a portion 94 of base 40 to a vacuum inlet 95. Inlet 95 is connected by a manifold 97 to the same source of vacuum (arrow 50 in FIG. 10) as that vacuum present in chamber 57.

As the effectors and directly associated vacuum cups 90 are moved downwardly to vacuum grasp and unload a disk or disks from the grinding stone any non-planarity, i.e., canting, of the disk on an uneven surface of the grinding stone is compensated for by the provided added width of contact with the disk by reason of the additional span of vacuum cups 90 and the flexibility of the lips 91.

The above description of embodiments of this invention is intended to be illustrative and not limiting. Other embodiments of this invention will be obvious to those skilled in the art in view of the above disclosure.

We claim:

1. An end effector for loading and unloading a magnetic information storage circular disk having a central aperture, onto and from a carrier surface, the carrier surface forming a processing station for the disk, said effector comprising:

an effector block;

an annular vacuum cup, including first vacuum apertures, attached to a lower end of said block and being sized to surround and to abut a peripheral top surface of the disk surrounding the disk central aperture;

at least one second spaced vacuum cup extending radially outwardly from the annular vacuum cup;

a vacuum source in communication with said vacuum apertures and to an interior of said at least one second spaced vacuum cup; and wherein imposition of vacuum from said vacuum source to said apertures and to said at least one second spaced vacuum cup vacuum holds the disk on said annular vacuum cup and on the at least one second spaced vacuum cup.

2. The effector of claim 1 wherein said at least one second spaced vacuum cup includes a cylindrical block including a central axial vertical through-bore in said block.

3. The effector of claim 1 wherein said at least one second spaced vacuum cup comprises three cups which are approximately equally spaced about said annular vacuum cup.

4. The effector of claim 1 wherein a bottom end of the at least one second spaced vacuum cup is substantially in the same plane as a bottom end of the annular vacuum cup and is at a radial distance such that in use the at least one second spaced vacuum cup vacuum holds radial portions of a disk to be unloaded from the carrier surface.

5. The effector of claim 1 further comprising a single vacuum source connected to said annular vacuum cup and the at least one second spaced vacuum cup.

6. The effector of claim 1 wherein the carrier surface is a bottom platen of a grinder stone.

7. The effector of claim 1 wherein the at least one second spaced vacuum cup has a flexible lip compensating for any non-planarity of a disk on the carrier surface.

8. The effector of claim 1 wherein the at least one second spaced vacuum cup comprises a series of second spaced vacuum cups approximately equally spaced about said annular vacuum cup.

* * * * *